United States Patent [19]

Pettenpaul et al.

[11] 4,377,030
[45] Mar. 22, 1983

[54] METALLIZATION OF SELECTIVELY IMPLANTED $A_{III}$-$B_V$ COMPOUND SEMICONDUCTORS

[75] Inventors: Ewald Pettenpaul, Unterhaching; Jakob Huber, Aying; Herbert Weidlich, Munich, all of Fed. Rep. of Germany

[73] Assignee: Siemens Aktiengesellschaft, Berlin & Munich, Fed. Rep. of Germany

[21] Appl. No.: 233,329

[22] Filed: Feb. 11, 1981

[30] Foreign Application Priority Data

Feb. 15, 1980 [DE] Fed. Rep. of Germany ....... 3005733

[51] Int. Cl.³ .................... H01L 29/48; H01L 29/56; H01L 21/265
[52] U.S. Cl. .................................. 29/576 B; 29/571; 148/1.5; 148/187; 357/15; 357/91; 427/88
[58] Field of Search .................. 148/1.5, 187; 29/571, 29/576 B; 427/88; 357/15, 22, 91

[56] References Cited

U.S. PATENT DOCUMENTS

| | | | |
|---|---|---|---|
| 4,089,020 | 5/1978 | Ikeda | 357/15 |
| 4,096,622 | 6/1978 | McIver | 29/576 B |
| 4,173,063 | 11/1979 | Kniepkamp | 148/1.5 |
| 4,188,710 | 2/1980 | Davey et al. | 148/175 |
| 4,196,439 | 4/1980 | Niehaus et al. | 357/15 |
| 4,213,840 | 7/1980 | Omori et al. | 357/15 |
| 4,265,934 | 5/1981 | Ladd, Jr. | 148/1.5 |
| 4,272,561 | 6/1981 | Rothman et al. | 357/15 |
| 4,301,188 | 11/1981 | Niehaus | 427/88 |

OTHER PUBLICATIONS

Dean et al., IEEE-Trans. Electron Devices, Jun. 1975, pp. 358-360.
Jaros et al., Solid St. Electronics, 18, (1975), 1029.
Kung et al., Electronics Letts., 13, (1977), 187-188.
Long et al., J. Vac. Sci. Tech., 19, (Oct. 1981), 531.

*Primary Examiner*—Upendra Roy
*Attorney, Agent, or Firm*—Herbert L. Lerner; Laurence A. Greenberg

[57] ABSTRACT

Fabricating a semiconductor arrangement with a semiconductor body of an $A_{III}$-$B_V$ compound, characterized that the semiconductor body is doped with different doping substances in such manner that for barrier and non-barrier contacts on different zones doped with these doping substances only one metallization is required.

7 Claims, 6 Drawing Figures

METALLIZATION OF SELECTIVELY IMPLANTED $A_{III}$-$B_V$ COMPOUND SEMICONDUCTORS

BACKGROUND OF THE INVENTION

1. Field of the Invention

The invention relates to a method for fabricating a semiconductor arrangement with a semiconductor body of an $A_{III}$-$B_V$ compound as well as to a semiconductor arrangement fabricated by this method.

DESCRIPTION OF THE PRIOR ART

"Semiconductor bodies" are understood here to be in particular a monocrystalline semiconducting or semiinsulating substrata or an epitaxial layer provided on a substrata directly or over one or several epitaxial semiconducting or semiinsulating layers. Semiconductor arrangements, furthermore, are, for instance, microwave diodes, field-effect transistors or integrated circuits, in which charge carriers flow in a thin film (with a thickness in the order of 1 to 0.1 $\mu$m) of high conductivity. A field-effect transistor comprises, for instance, a semiinsulating GaAs substrata, in which doped zones are generated preferably by ion implanation, a non-barrier source or drain electrode, respectively, and a blocking gate electrode.

In the fabrication of field-effect transistors, an ohmic metallization for the source and drain electrode used to be deposited first. Subsequently, a Schottky electrode for the gates between the source and the drain electrode was adjusted by means of photo techniques and realized by a second metallization and a lifting technique. In this process, the adjustment accuracy enters fully into gate-source distance.

SUMMARY OF THE INVENTION

It is an object of the invention to provide a method for fabrication of semiconductor arrangements with electrode spacings in the $\mu$m- and sub-$\mu$m region with only one metallization and high adjustment accuracy.

With the foregoing and other objects in view, there is provided in accordance with the invention a method for fabricating a semiconductor arrangement with a semiconductor body of an $A_{III}$-$B_V$ compound with different doping substances on different zones of the semiconductor body to form barrier and non-barrier zones, and applying only one metallization to the surface to obtain barrier and non-barrier contacts on the different zones.

Other features which are considered as characteristic for the invention are set forth in the appended claims.

Although the invention is illustrated and described herein as embodied in a method for fabricating a semiconductor arrangement, and semiconductor arrangement fabricated by this method, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings, in which.

DETAILED DESCPRITION OF THE INVENTION

Figure 1:
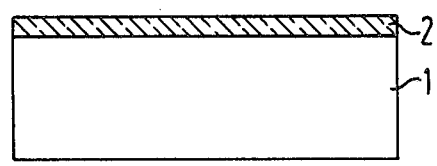
FIG. 1 illustrates the first process step in fabricating a field-effect transistor by sputtering or atomizing a silicon nitride layer on a GaAs semiinsulating layer.
Figure 2:
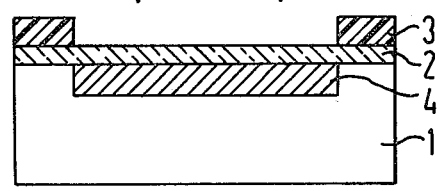
FIG. 2 shows the addition of a structured photoresist layer followed by ion implantation with $Si^+$.
Figure 3:
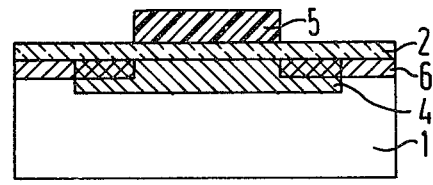
FIG. 3 shows the photoresist layer removed and the addition of a second structured photoresist layer followed by ion implantation with $Ge^+$.

In accordance with the invention, the semiconductor body is doped with different doping substances in such a manner that only one metallization is required for barrier and non-barrier contacts in zones doped with these doping substances.

The invention makes it possible to fabricate, for instance, microwave semiconductor components which make possible, because control electrodes (gates) no longer need to be adjusted, increasing miniaturization such as, for instance, field-effect transistors with a gate length of 0.5 $\mu$m and source-gate or drain-gate distances of at most 1 $\mu$m. In addition, power field-effect transistors can also be created by multiple parallel connection of individual components, and integrated circuits with higher reliability because adjustment errors no longer occur. This makes possible an increase of the gain, a reduction of the noise figure and an increase of the power of microwave components. A preferred method for fabricating a semiconductor arrangement with a semiinsulating substrata as the semiconductor body is characterized by (a) placing at least one first conducting layer (4) by local ion implantation with a dose of $10^{12}$ to $10^{14}$ atoms/cm$^2$ of one of the elements Te, S, Se, Si on an exposed surface or a surface covered with a thin passivating layer (2), of the substrata (1) so that the first layer (4) contains $1 \times 10^{15}$ to $5 \times 10^{17}$ doping atoms/cm$^3$, (b) at another place, placing at least one second conducting layer (6) by local ion implantation with a dose of $10^{14}$ to $10^{17}$ atoms/cm$^2$ of, for instance, the element Ge on an exposed surface, or a surface covered with a thin passivating layer (2), of the substrata (1) so that the second layer (6) contains more than $10^{18}$ doping atoms/cm$^3$, and (c) deposition of a single metal layer (8) for preparing barrier and non-barrier contacts, barrier contacts being generated on the first layer (4) and conducting contacts on the second layer (6). The passivating layer may be a silicon nitride layer about 0.05 $\mu$m thick. The metal layer may be a Cr/Au layer or a Cr/Au/W/Aū layer.

The semiconductor arrangement fabricated by the above method may be a diode, a field-effect transistor or an integrated circuit composed of these elements and additional passive elements.

Another preferred method for fabricating a semiconductor arrangement with a semiconductor body for an $A_{III}$-$B_V$ compound, in which the semiconductor body is a semiconductor substrata with a doping concentration of more than $10^{17}$ impurities/cm$^3$, characterized by (a) generating a surface layer 0.5 to 5 μm thick with $10^{15}$ to $5\times10^{17}$ impurities/cm$^3$ by diffusion or ion implantation, (b) at another place, placing at least one conducting layer by local implantation with a dose of $10^{14}$ to $10^{17}$ atoms/cm$^2$, for instance, of the element Ge on an exposed surface, or a surface covered with a thin passivating layer, of the semiconductor body, so that the layer contains more than $10^{18}$ doping atoms/cm$^3$, and (c) deposition of a single metal layer for preparing barrier and non-barrier contacts, barrier contacts being generated on the surface layer and conducting contacts on the layer. The semiconductor arrangement may be fabricated in accordance with the above method as a beam lead Schottky diode.

To fabricate barrier and non-barrier contacts, the electrode zones, for instance, source, drain and gate are thus defined by means of photo varnish (photoresist) structures; subsequently, a metallization (Cr/Au) is deposited over the entire surface by a vapor deposition process, and the metal layer outside of the electrode zones is lifted off by means of organic solvents. After the alloying, barrier contacts are produced in regions with conductive layers with less than $5\times10^{17}$ doping atoms/cm$^3$ and non-barrier contacts in regions with conductive layers having more than $10^{18}$ doping atoms/cm$^3$. The semiconductor arrangement fabricated by this method can be, for instance, a diode, a field-effect transistor or an integrated circuit.

Through local implantation of $10^{12}$ to $10^{14}$ atoms/cm$^2$ with, for instance, Si$^+$, a conducting layer of $1\times10^{15}$ to $5\times10^{17}$ doping atoms/cm$^3$ is created for the subsequent channel zone after implantation damage has been healed.

At another place, a second local implantation of $10^{14}$ to $10^{17}$ atoms/cm$^2$ with, for instance, Ge$^+$ is performed, a second conducting layer with more than $10^{18}$ doping atoms/cm$^3$ being produced after the anealing process.

To fabricate barrier and non-barrier contacts, only a single metal layer sequence, for instance, Cr/Au or Cr/Au/W/Au, is deposited; in regions with the lower concentration, barrier contacts are produced and in regions with high concentrations, non-barrier contacts.

The spacing between barrier and non-barrier contacts is determined by the imaging accuracy of a photographic technique alone. The boundary of the heavily implanted region must fall between the contour of the two types of contact. Making both types of contact with only one photographic technique and metal deposition provides decisive advantages for the photographic technique because the critical imaging of the gate can be on a completely plane surface and because the yield, which according to the present method, is determined by two critical metal lifting techniques, depends on only one lifting technique according to the method of the invention.

Figure 4:
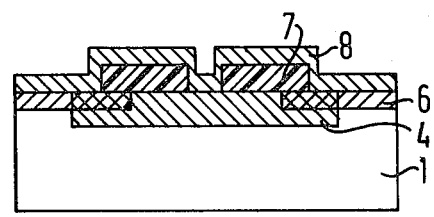
FIG. 4 shows provision of a structured photoresist layer and deposition over the entire surface of a Cr film and an Au film.
Figure 5:
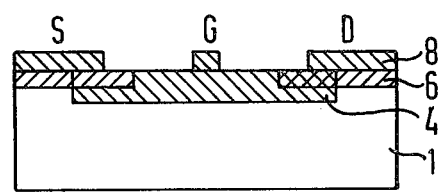
FIG. 5 shows removal of metal over photoresist layer leaving remaining metal pattern.
Figure 6:
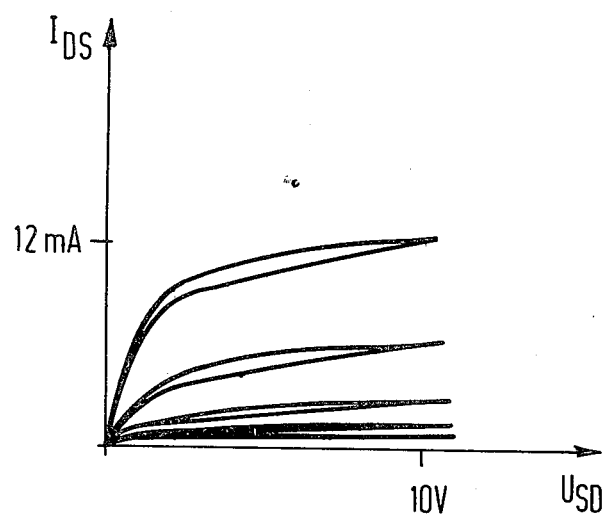
FIG. 6 shows the charactersticis of a field-effect transistor made by the method in accordance with the invention.

In the following, an embodiment example of the invention will be explained in greater detail, making reference to the drawings, where FIGS. 1 to 5 show different process steps for fabricating a field-effect transistor, and FIG. 6 shows the output family of characteristics of a field-effect transistor fabricated according to the invention where the source-drain voltage $U_{SD}$ is plotted along the abscissa and the (drain-source) saturation current $I_{DS}$ on the ordinate and the individual curves are obtained for gate-source voltages which are increased by 500 mV.

FIG. 1 shows a semiinsulating GaAs substrata 1, into which adjustment marks, not shown, may optionally be etched for subsequent photoresist adjusting steps and which is subsequently provided with a silicon nitride passivating layer 2 of 0.05 μm thick, by sputtering or atomizing.

The so prepared semiconductor body is provided with a first structured photoresist layer 3, 1 μm thick (FIG. 2) which serves as mask for a subsequent first ion implantation with Si$^+$ indicated by arrows 10. This first ion implantation is performed with a dose of $6\times10^{12}$ cm$^{-2}$ Si$^+$-atoms and an energy of 150 keV and yields a local conducting layer 4 for the subsequent channel zone of the field-effect transistor after the lattice defects have been healed.

The first photoresist layer 3 is then removed, for instance, by plasma incineration and the semiconductor body is provided with a second structured photoresist layer 5, 1 μm thick (FIG. 3), which serves as a mask for a second ion implantation with Ge$^+$, indicated by arrows 11. This second ion implantation is performed with a dose of $1\times10^{15}$ cm$^{-2}$ Ge$^+$-atoms and an energy of 150 keV and yields, after the photoresist is removed and the lattice defects have been healed, a locally conducting layer 6 for the later contact region of source and drain of the field-effect transistor.

After the passivating layers used for the healing (not shown) are removed by etching, the semiconductor body is provided with a structured photoresist layer 7, 1 μm thick, which determines the electrode zones of the source S, drain D and gate G in windows. This is followed by vapor deposition over the entire surface with a layer 8 of a layer sequence of a Cr-film 0.027 μm thick and an Au-film 0.13 μm thick (FIG. 4).

FIG. 5 shows the remaining metal pattern after the metal over the photoresist layer 7 was lifted off by a treatment in organic solvents, for instance, acetone. The semiconductor body is subsequently subjected to a temperature process at 400° C. in a nitrogen atmosphere for about 10 minutes. The distance between the source and the drain electrode S and D, respectively, is 8 μm and the gate length in the direction of the current is 1 μm.

The family of characteristics of a field-effect transistor (see FIG. 6) which was made by means of the method according to the invention shows, for instance, a saturation current of 12 mA, a slope of 10 mA/V at 3 V, a pinch-off voltage of 2.5 V corresponding to a residual current of 50 μA as well as source-drain, gate-source and gate-drain resistances of about 100 ohms and gate-source as well as gate-drain voltages of 15 V.

Gallium arsenide field-effect transistors, which have been made to date by the method according to the invention, show lower slopes and higher resistances than field-effect transistors of conventional design.

The reason for this is in particular that the structures used have excessively large source-gate spacings. A structure adapted to the tolerances of the new method with, for instance, a source-gate spacing of 1 μm permits electrical data comparable to the conventional method with better uniformity.

We claim:

1. Method for fabricating a semiconductor arrangement using phototechnique processes and a semiconductor body of an A$_{III}$–B$_V$ compound, which comprises doping a semiconductor body of an A$_{III}$–B$_V$ compound with a first doping substance in a concentration to produce non-barrier zones at parts of the surface of the semiconductor body, and with a second doping substance in a concentration to produce barrier zones at other parts of the semiconductor surface, and applying only one metallization to the surface to obtain barrier and non-barrier contacts on the different zones.

2. Method for fabricating a semiconductor arrangement with a semiinsulating substrate as a semiconductor body of an $A_{III}$-$B_V$ compound, which comprises doping a semiconductor body of an $A_{III}$-$B_V$ compound with different doping substances on different zones of the semiconductor body to form barrier and non-barrier zones, and applying only one metallization to the surface to obtain barrier and non-barrier contacts on the differend zones and wherein (a) at least one first conducting layer is placed by a local ion implantation with a dose of $10^{12}$ to $10^{14}$ atoms/cm$^2$ of one of the elements selected from the group consisting of Te, S, Se and Si on an exposed surface or a surface covered with a thin passivating layer of the substrate so that the first year contains $1 \times 10^{15}$ to $5 \times 10^{17}$ doping atoms/cm$^3$, (b) at another place, placing at least one second conducting layer by local ion implantation with a dose of $10^{14}$ to $10^{17}$ atoms/cm$^2$ of the element Ge on an exposed surface, or a surface covered with a thin passivating layer of the substrate so that the second layer contains more than $10^{18}$ doping atoms/cm$^3$, and (c) depositing a single metal layer for preparing barrier and non-barrier contacts, barrier contacts being generated on the first layer and conducting contacts on the second layer.

3. Method for fabricating semiconductor arrangement according to claim 2, wherein the semiconductor arrangement is a diode, a field-effect transistor or an integrated circuit composed of these elements and additional passive elements.

4. Method for fabricating a semiconductor arrangement with a semiconductor body of an $A_{III}$-$B_V$ compound, which comprises doping a semiconductor body of an $A_{III}$-$B_V$ compound with different doping substances on different zones of the semiconductor body to form barrier and non-barrier zones, and applying only one metallization to the surface to obtain barrier and non-barrier contacts on the different zones, wherein the semiconductor substrate with a doping concentration of more than $10^{17}$ impurities/cm$^3$, by (a) generating a surface layer 0.5 to 5 $\mu$m thick with $10^{15}$ to $5 \times 10^{17}$ impurities/cm$^3$ by diffusion or ion implantation, (b) at another place, placing at least one conducting layer by local implantation with a dose of $10^{14}$ to $10^{17}$ atoms/cm$^2$, of the element Ge on an exposed surface, or a surface covered with a thin passivating layer, of the semiconductor body, so that the layer contains more than $10^{18}$ doping atoms/cm$^3$, and (c) depositing a single metal layer for preparing barrier and non-barrier contacts, barrier contacts being generated on the surface layer and conducting contacts on the conducting layer.

5. Method for fabricating a semiconductor arrangement according to claim 4, wherein the semiconductor arrangement is a beam lead Schottky diode.

6. Method according to claim 2 or claim 4, wherein the passivating layer is a silicon nitride layer about 0.05 $\mu$m thick.

7. Method according to claim 2 or claim 4, wherein the metal layer is a Cr/Au layer or a Cr/Au/W/Aū layer.

* * * * *